US010818830B2

(12) United States Patent
Kim et al.

(10) Patent No.: US 10,818,830 B2
(45) Date of Patent: *Oct. 27, 2020

(54) LED CHIP WITH IMPROVED BONDING STRENGTH AND LED MODULE USING THE LED CHIP

(71) Applicant: LUMENS CO., LTD., Yongin-si, Gyeonggi-do (KR)

(72) Inventors: Daewon Kim, Yongin-si (KR); Yelim Won, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/829,478

(22) Filed: Mar. 25, 2020

(65) Prior Publication Data

US 2020/0227606 A1 Jul. 16, 2020

Related U.S. Application Data

(63) Continuation of application No. 16/108,158, filed on Aug. 22, 2018, now Pat. No. 10,644,212.

(30) Foreign Application Priority Data

Nov. 27, 2017 (KR) .......................... 10-2017-0159186

(51) Int. Cl.
| | |
|---|---|
| *H01L 33/62* | (2010.01) |
| *H01L 33/40* | (2010.01) |
| *H01L 33/38* | (2010.01) |
| *H01L 23/00* | (2006.01) |
| *H01L 33/44* | (2010.01) |

(52) U.S. Cl.
CPC .............. *H01L 33/62* (2013.01); *H01L 24/14* (2013.01); *H01L 33/387* (2013.01); *H01L 33/40* (2013.01); *H01L 33/44* (2013.01)

(58) Field of Classification Search
CPC combination set(s) only.
See application file for complete search history.

(56) References Cited

U.S. PATENT DOCUMENTS

| | | | | |
|---|---|---|---|---|
| 2012/0241793 | A1* | 9/2012 | In ........................... | H01L 33/486 257/98 |
| 2014/0054766 | A1* | 2/2014 | Hashino ............... | B23K 35/025 257/737 |
| 2015/0280071 | A1* | 10/2015 | Takenaga .............. | H01L 33/382 257/99 |
| 2017/0108937 | A1* | 4/2017 | Kim ...................... | G06F 1/1662 |
| 2018/0097148 | A1* | 4/2018 | Hsu ......................... | H01L 33/40 |
| 2019/0051801 | A1* | 2/2019 | Seo .......................... | H01L 33/38 |
| 2019/0148601 | A1* | 5/2019 | Park ....................... | H01L 33/385 257/88 |

* cited by examiner

*Primary Examiner* — Nduka E Ojeh
(74) *Attorney, Agent, or Firm* — Mei & Mark LLP (57) ABSTRACT

An LED module is disclosed. The LED module includes: a mount substrate including electrodes; an LED chip including a semiconductor stacked structure, a passivation layer covering the outer surface of the semiconductor stacked structure, and electrode pads connected to the outer surface of the semiconductor stacked structure through openings formed in the passivation layer; and solder bumps connecting the electrode pads to the corresponding electrodes and formed using a solder material represented by Sn-M (where M is a metal).

19 Claims, 7 Drawing Sheets

LED CHIP WITH IMPROVED BONDING STRENGTH AND LED MODULE USING THE LED CHIP

This is a continuation of U.S. application Ser. No. 16/108,158, filed Aug. 22, 2018, which is incorporated herein by reference.

BACKGROUND OF THE INVENTION

1. Field of the Invention

The present invention relates to an LED chip and an LED module using the LED chip. More specifically, the present invention relates to an LED module in which an improved bonding strength between a constituent metal component of electrode pads of an LED chip and a constituent metal component of solders and an enhanced ohmic contact between semiconductor layers and metals are ensured.

2. Description of the Related Art

Figure 1:
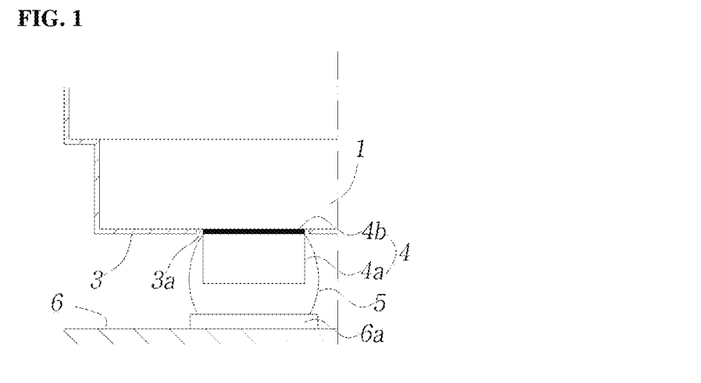
FIG. 1 illustrates an exemplary structure of a conventional LED module in which an electrode pad provided in an LED chip is connected to an electrode pattern formed on a mount substrate through a solder.

An LED module includes a mount substrate and an LED chip mounted on the mount substrate. In the LED module, solders are interposed between electrode pads formed in the LED chip and electrode patterns formed on the mount substrate to connect the electrode pads to the electrode patterns. The LED chip may be of a flip-chip type. In this case, a pair of electrode pads having different polarities are connected to a pair of electrode patterns of a mount substrate through solder bumps. Alternatively, the LED chip may be of a vertical type. In this case, a lower electrode pad is connected to an electrode pattern of a mount substrate through a solder and an upper electrode pad having a polarity different from that of the lower electrode pad is provided. FIG. 1 illustrates an exemplary structure of a conventional LED module. In the LED module, an electrode pad provided in an LED chip is connected to an electrode pattern formed on a mount substrate through a solder. Referring to FIG. 1, a passivation layer 3 covers the upper end surface and/or side wall surface of a semiconductor stacked structure 1 including a first conductive semiconductor layer, an active layer, and a second conductive semiconductor layer. An opening 3a is formed in the passivation layer 3. The surface of the first conductive semiconductor layer or the surface of the second conductive semiconductor layer is partially exposed through the opening 3a. The electrode pad 4 is formed on the surface of the semiconductor stacked structure 1 through the opening 3a. The electrode pad 4 includes a pad body 4a and an ohmic contact layer 4b formed under the pad body 4a. The ohmic contact layer 4b is in contact with the semiconductor stacked structure 1 inside the opening 3a. A solder bump 5 is formed using a solder paste and connects the electrode pad 4 to the electrode pattern 6a formed on the mount substrate. The solder bump 5 covers the side surface of the electrode pad 4 as well as the surface of the front end of the electrode pad 4. For example, the solder paste may be selected from Sn—Ag, Sn—Bi, Sn—Zn, Sn—Ag—Cu, Sn—Cu, and Sn—Au alloys, all of which contain Sn. The surface of the front end of the pad body 4a is formed using Au that has a high bonding strength to the solder and exhibits good antioxidative properties. The electrode pad 4 consists of one or more Au layers, which account for at least 40% of the total thickness.

Figure 2:
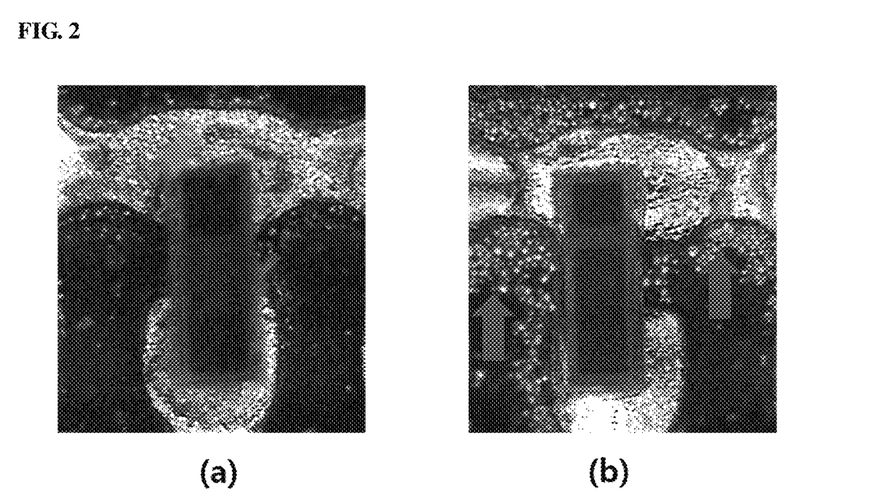
FIGS. 2 and 3 are images explaining the problems of the prior art.

In the case where the content of Au in the Au layers of the electrode pad is above a predetermined level, impurities may be produced due to unnecessary bonding between the constituent Sn component of the solder and the constituent Au component of the electrode pad, as indicated by the arrows in (b) of FIG. 2. The impurities deteriorate the bonding strength between the electrode pad and the electrode pattern of the mount substrate, and as a result, the final product is likely to be defective. Such defects include light emission failure and weak light emission. (a) of FIG. 2 is an image showing a normal bonding state between the electrode pad and the solder.

Figure 3:
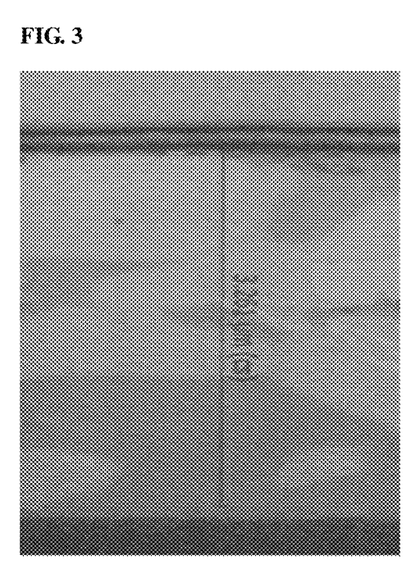

Particularly, the reliability of the LED module may deteriorate when the number of chemical bonds between the Sn component of the solder and the Au component of the electrode pad on the side surface of the electrode pad 4 is excessively large compared to that at the inner side of the electrode pad 4, with the result that the electrode pad 4 is likely to be peeled off from the electrode pattern of the mount substrate. This peeling leads to light emission failure. Indeed, a smaller number of chemical bonds between the Sn component of the solder and the Au component of the electrode pad is more advantageous for reliability. Further, the solder material may enter the opening 3a during formation of the solder bump 5, deteriorating the performance of the ohmic contact layer 4b. Particularly, when the LED chip is based on GaAs, an alloy material including Au, such as GeAu, GeNiAu, TiPtAu, BeAu or PdGeAu, may be used to form the ohmic contact layer under the electrode pad. In this case, the Sn component of the solder passes through the opening 3a, reaches the region where the ohmic contact layer is formed, and chemically bonds with the Au component, increasing the risk that the electrical properties of the ohmic contact layer 4a may deteriorate. FIG. 3 is a microscopy image showing metal compounds produced by the Sn component penetrated into the ohmic contact layer formed under the electrode pad.

SUMMARY OF THE INVENTION

The present invention has been made in an effort to solve the problems of the prior art, and it is an object of the present invention to provide an LED module in which an improved bonding strength between a constituent metal component of electrode pads of an LED chip and a constituent metal component of solders and an enhanced ohmic contact between semiconductor layers and metals are ensured.

An LED chip according to one aspect of the present invention includes: a semiconductor stacked structure including a first conductive semiconductor layer and an active layer and a second conductive semiconductor layer sequentially formed on one area of the first conductive semiconductor layer; a passivation layer covering the outer surface of the semiconductor stacked structure and including a first opening and a second opening; a first electrode pad connected to the first conductive semiconductor layer through the first opening; and a second electrode pad connected to the second conductive semiconductor layer through the second opening, wherein the first electrode pad includes a multilayer body including a plurality of metal layers and a contact body connected to the multilayer body and the contact body includes a surface contact part in contact with the passivation layer outside the first opening and an ohmic contact part in contact with the first conductive semiconductor layer through the first opening, and wherein the second electrode pad includes a multilayer body including a plurality of metal layers and a contact body connected to the multilayer body and the contact body includes a surface contact part in contact with the passivation layer outside the second opening and an ohmic contact part in contact with the second conductive semiconductor layer through the second opening.

According to one embodiment, each of the multilayer bodies includes a structure consisting of different metal layers stacked alternately on one another.

According to one embodiment, each of the surface contact parts includes a common contact metal layer in contact with the passivation layer and the ohmic contact part.

According to one embodiment, the height of the contact interface between the common contact metal layer and the passivation layer is different from that of the contact interface between the common contact metal layer and the ohmic contact part.

According to one embodiment, each of the ohmic contact parts includes an ohmic contact layer in direct contact with the first or second conductive semiconductor layer and one or more metal layers formed on the ohmic contact layer and interposed between the ohmic contact layer and the surface contact part.

According to one embodiment, each of the multilayer bodies includes an Au end layer at an end thereof.

According to one embodiment, the Au end layer has a thickness of less than 1500 Å and the total thickness of Au layers, including the Au end layer, is less than 15% of the thickness of the multilayer body.

According to one embodiment, each of the multilayer bodies includes a metal stacked structure formed by stacking two or more metals selected from the group consisting of Pt, Cr, Al, Ni, Ti, Au, Cu, Mo, W and Au.

According to one embodiment, the ratio of the area of the first or second opening to the surface area of the corresponding ohmic contact layer is from 0.1:1 to 0.3:1.

An LED chip according to a further aspect of the present invention includes: a semiconductor stacked structure including a first conductive semiconductor layer, an active layer, and a second conductive semiconductor layer; a passivation layer including an opening through which a portion of the lower surface of the semiconductor stacked structure is exposed; an upper electrode pad connected to the upper surface of the semiconductor stacked structure; and a lower electrode pad connected to the lower surface of the semiconductor stacked structure through the opening, wherein the lower electrode pad includes a multilayer body including a plurality of metal layers and a contact body connected to the multilayer body and the contact body includes a surface contact part in contact with the passivation layer outside the opening and an ohmic contact part in contact with the first or second conductive semiconductor layer through the opening.

According to one embodiment, the multilayer body includes a structure consisting of different metal layers stacked alternately on one another.

According to one embodiment, the surface contact part includes a common contact metal layer in contact with the passivation layer and the ohmic contact part.

According to one embodiment, the height of the contact interface between the common contact metal layer and the passivation layer is different from that of the contact interface between the common contact metal layer and the ohmic contact part.

According to one embodiment, the ohmic contact part includes an ohmic contact layer in direct contact with the first or second conductive semiconductor layer and one or more metal layers formed on the ohmic contact layer and interposed between the ohmic contact layer and the surface contact part.

According to one embodiment, each of the multilayer bodies includes an Au end layer at an end thereof.

According to one embodiment, the Au end layer has a thickness of less than 1500 Å and the total thickness of Au layers, including the Au end layer, is less than 15% of the thickness of the multilayer body.

According to one embodiment, the multilayer body includes a metal stacked structure formed by stacking two or more metals selected from the group consisting of Pt, Cr, Al, Ni, Ti, Au, Cu, Mo, W and Au.

According to one embodiment, the ratio of the area of the opening to the surface area of the ohmic contact layer is from 0.1:1 to 0.3:1.

An LED module according to another aspect of the present invention includes: a mount substrate including electrodes; an LED chip including a semiconductor stacked structure, a passivation layer covering the outer surface of the semiconductor stacked structure, and electrode pads connected to the outer surface of the semiconductor stacked structure through openings formed in the passivation layer; and solder bumps connecting the electrode pads to the corresponding electrodes and formed using a solder material represented by Sn-M (where M is a metal), wherein each of the electrode pads includes a multilayer body including a plurality of metal layers and a contact body connected to the multilayer body, the contact body includes a surface contact part in contact with the passivation layer outside the opening and an ohmic contact part in contact with the semiconductor stacked structure through the opening, and the surface contact part in contact with the passivation layer blocks the Sn component of the solder bump from reaching the ohmic contact part through the opening.

According to one embodiment, the ohmic contact part includes a metal compound including Au.

According to one embodiment, the ohmic contact part includes an ohmic contact layer formed using a metal compound selected from the group consisting of GeAu, GeNiAu, TiPtAu, BeAu, and PdGeAu.

According to one embodiment, the semiconductor stacked structure includes GaAs semiconductor layers.

According to one embodiment, each of the solder bumps partially covers the side surface of the electrode pad, the electrode pad includes a metal stacked structure formed by stacking two or more metals, and Au is absent at a height of the metal stacked structure where the solder bump covers.

According to one embodiment, the multilayer body includes an Au end layer, a diffusion barrier layer in contact with the Au end layer, and an adhesive layer in contact with the diffusion barrier layer.

According to one embodiment, the diffusion barrier layer is a Pt layer and the adhesive layer is a Ti layer.

According to one embodiment, the multilayer body includes an Au end layer, a metal stacked structure consisting of Al layers and Ti layers stacked alternately on one another is formed between the Au end layer and the ohmic contact part, and the total thickness of the Al layers is two times that of the Ti layers.

According to one embodiment, the thickness of the Au end layer is smaller than those of the other metal layers in the metal stacked structure.

According to the present invention, the bonding strength between the electrode patterns of the mount substrate and the LED chip is prevented from deterioration resulting from unnecessary chemical bonding between Au as a constituent metal component of the electrode pads of the LED chip and a constituent component of the solders. As a result, the LED chip does not suffer from the problem of weak light emission or light emission failure, ensuring high reliability of the final product.

Other advantages and effects of the invention will be better understood from the following description of embodiments.

DETAILED DESCRIPTION OF THE INVENTION

Embodiments of the present invention will now be described in detail with reference to the accompanying drawings. These embodiments are provided so that this disclosure will be thorough and complete, and will fully convey the scope of the invention to those skilled in the art. Accordingly, the present invention may be embodied in many different forms and should not be construed as limited to the exemplary embodiments set forth herein. In the drawings, the dimensions, such as widths, lengths and thicknesses, of elements may be exaggerated for clarity. The same reference numerals denote the same elements throughout the specification.

Figure 4:
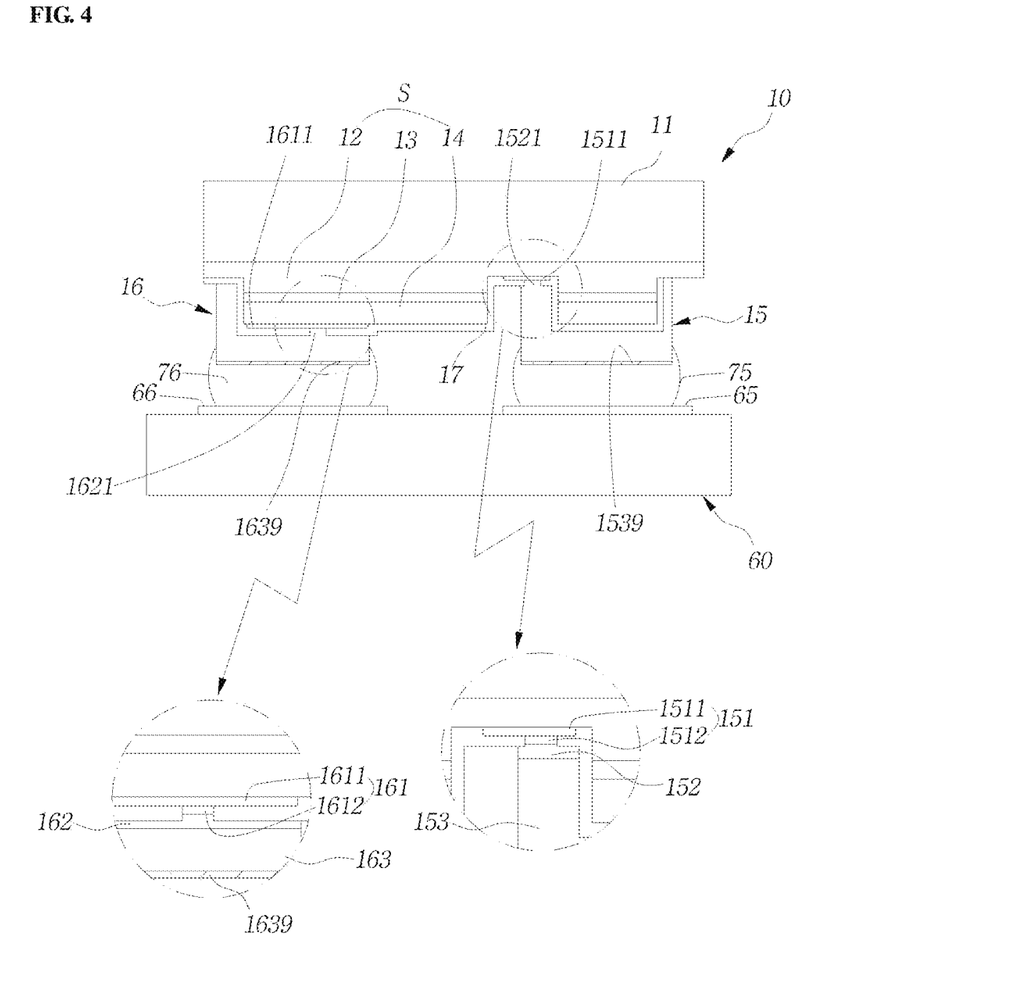
FIG. 4 is an explanatory view illustrating an LED module using an LED chip according to one embodiment of the present invention.

Referring to FIG. 4, an LED module according to one embodiment of the present invention includes a mount substrate 60 and an LED chip 10 mounted on the mount substrate 60. When the LED chip 10 is mounted on the mount substrate 60, electrode pads 15 and 16 of the LED chip 10 are connected to electrodes 65 and 66 of the mount substrate 60 through solder bumps 75 and 76, respectively.

The LED chip 10 includes a substrate 11 and a semiconductor stacked structure S disposed on the substrate 11. The semiconductor stacked structure S includes an active layer 13 and a second conductive semiconductor layer 14 sequentially formed on one area of the outer surface of a first conductive semiconductor layer 12. Here, the first conductivity may be n-type or p-type. The second conductivity is opposite to the first conductivity and may be n-type or p-type.

In the semiconductor stacked structure S, the outer surface of the second conductive semiconductor layer 14 is located at the most distant position from the substrate 11. The semiconductor stacked structure S is etched from the outer surface of the second conductive semiconductor layer 14 such that portions including the total thickness of the second conductive semiconductor layer 14 and the active layer 13 and only portions of the thickness of the first conductive semiconductor layer 12 are removed to form grooves. The bottoms of the grooves form the outer surface of the first conductive semiconductor layer 12. The transverse cross-section of the semiconductor stacked structure S is divided into a relatively large transverse cross-section of a first light emitting portion and a relatively small transverse cross-section of a second light emitting portion. The first and second light emitting portions are defined by the grooves.

As used herein, the term "outer surface" is defined to mean the upper or bottom surface exposed to the outside during and/or after production rather than the side surface.

In the LED chip 10, a first ohmic contact layer 1511 having predetermined thickness and width is formed on one area of the outer surface of the first conductive semiconductor layer 12 and a second ohmic contact layer 1611 having predetermined thickness and width is formed on one area of the outer surface of the second conductive semiconductor layer 14. The first ohmic contact layer 1511 is a portion of the first electrode pad 15 and the second ohmic contact layer 1611 is a portion of the second electrode pad 16.

The LED chip 10 includes an electrically insulating passivation layer 17 that covers the substrate 11 and the outer surface and side surface of the semiconductor stacked structure S. The first ohmic contact layer 1511 and the second ohmic contact layer 1611 directly formed on portions of the outer surface of the semiconductor stacked structure S are covered by the passivation layer 17.

Figure 9:
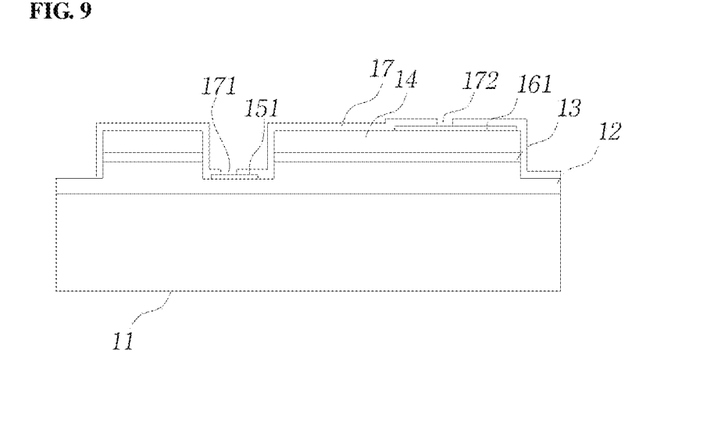
Figure 10:
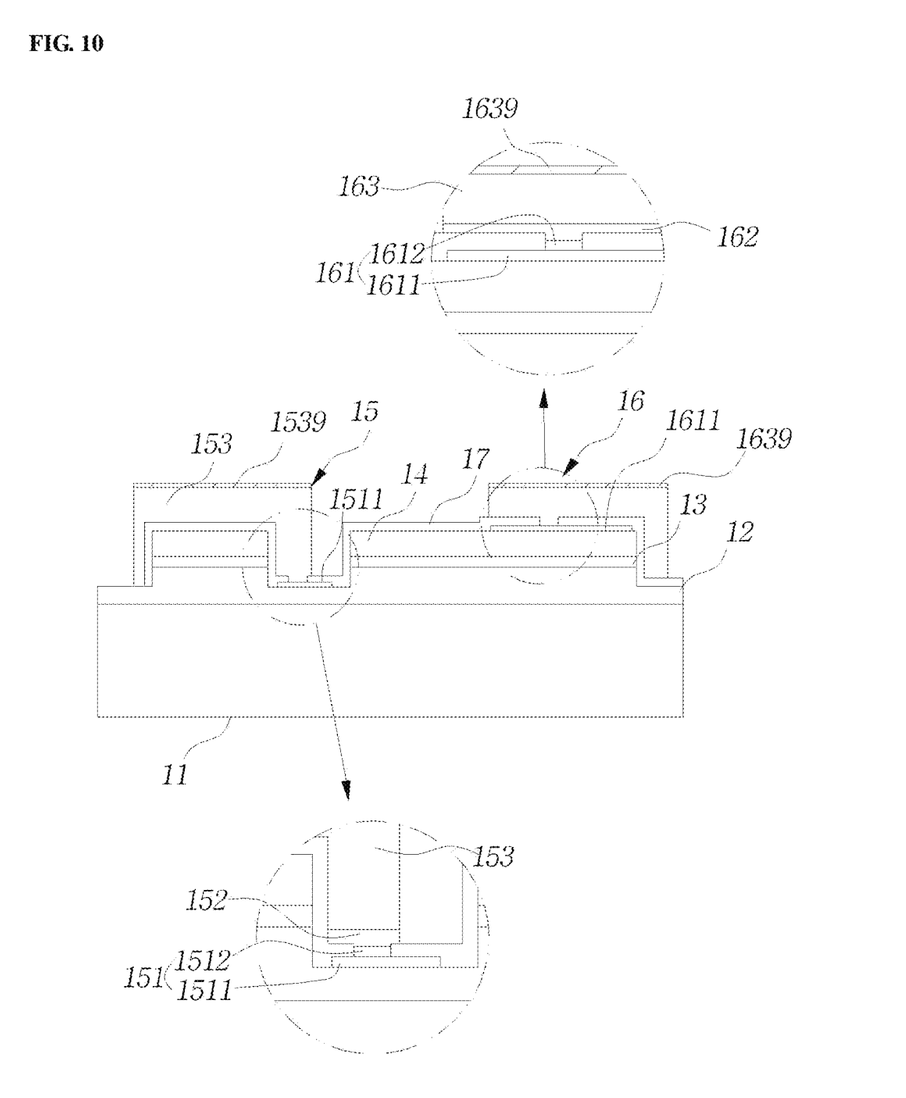

The passivation layer 17 includes a first opening 171 (see FIG. 9) through which the outer surface of the first ohmic contact layer 1511 is sectionwise exposed and a second opening 172 (see FIG. 9) through which the outer surface of the second ohmic contact layer 1611 is sectionwise exposed. The ratio of the area a1 of the first opening 171 (see FIG. 9) to the area A1 of the outer surface of the first ohmic contact layer 1511 and the ratio of the area a2 of the second opening 172 (see FIG. 5) to the area A2 of the outer surface of the second ohmic contact layer 1611 can be represented by:

$$a1/A1 \approx 0.1 \sim 0.3, a2/A2 \approx 0.1 \sim 0.3$$

The area of the first opening 171 (see FIG. 9) is larger than that of the second opening 172 (see FIG. 9), which is preferable for current diffusion.

When the semiconductor stacked structure S consists of GaN semiconductor layers, Ni, Cr, W or Ti can be advantageously used for the first ohmic contact layer 1511 and the second ohmic contact layer 1611. Alternatively, the semiconductor stacked structure S may consist of GaAs semiconductor layers. In this case, an alloy material including Au, such as GeAu, GeNiAu, TiPtAu, BeAu or PdGeAu, may be advantageously used for the first ohmic contact layer 1511 and the second ohmic contact layer 1611.

The first electrode pad 15 includes a multilayer body 153 including a plurality of metal layers and a contact body connected to the multilayer body 153. The contact body includes a surface contact part 152 in contact with the passivation layer 17 outside the opening 171 and an ohmic contact part 151 in contact with the first conductive semiconductor layer 12 through the opening 171.

Preferably, the multilayer body 153 includes a stacked structure consisting of a plurality of different metal layers stacked alternately on one another, which will be explained in detail hereinafter. The surface contact part 152 includes a common contact metal layer in simultaneous contact with the passivation layer 17 and the ohmic contact part 151. The surface contact part 152 may be a single metal layer. In this case, the surface contact part 152 may be the same as the common contact metal layer. Alternatively, the surface contact part 152 may include two or more metal layers. In this case, the surface contact part 152 may be provided with one or more metal layers interposed between the common contact metal layer and the multilayer body 153 as well as the common contact metal layer in simultaneous contact with the passivation layer 17 and the ohmic contact part 151.

The height of the contact interface between the common contact metal layer of the surface contact part 152 and the passivation layer is different from that of the contact interface between the common contact metal layer and the ohmic contact part 151. This arrangement further increases the bonding strengths of the surface contact part 152 to the passivation layer 17 formed using SiN and the ohmic contact part 151 formed using a metal.

Preferably, the ohmic contact part 151 includes one or more metal layers 1512 formed on the ohmic contact layer 1511 and interposed between the ohmic contact layer 1511 and the surface contact part 152 in addition to the ohmic contact layer 1511 in direct contact with the first conductive semiconductor layer 12.

Here, 70 to 90% of the area of the outer surface of the first ohmic contact layer 1511 is covered by the passivation layer 17 and only 10 to 30% of the area of the outer surface of the first ohmic contact layer 1511 is exposed to the outside through the first opening 171 (see FIG. 9) formed in the passivation layer 17. The surface contact part 152 includes a protrusion protruding from an insulating contact area in contact with the passivation layer 17 and including a current-carrying contact area in contact with the ohmic contact part 151 through the first opening 171 (see FIG. 9). Accordingly, the current-carrying contact area is placed inside the insulating contact area and the surface area of the insulating contact area is larger than the surface area of the current-carrying contact area. Due to the presence of the protrusion, the first electrode pad 15 is substantially "T" shaped in cross section.

The second electrode pad 16 includes a multilayer body 163 including a plurality of metal layers and a contact body connected to the multilayer body 163. The contact body includes a surface contact part 162 in contact with the passivation layer 17 outside the opening 172 and an ohmic contact part 161 in contact with the second conductive semiconductor layer 14 through the opening 172.

Preferably, the multilayer body 163 includes a stacked structure consisting of a plurality of different metal layers stacked alternately on one another, which will be explained in detail hereinafter. The surface contact part 162 includes a common contact metal layer in simultaneous contact with the passivation layer 17 and the ohmic contact part 161. The surface contact part 162 may be a single metal layer. In this case, the surface contact part 162 may be the common contact metal layer. Alternatively, the surface contact part 162 may include two or more metal layers. In this case, the surface contact part 162 may be provided with one or more metal layers interposed between the common contact metal layer and the multilayer body 163 as well as the common contact metal layer in simultaneous contact with the passivation layer 17 and the ohmic contact part 161.

The height of the contact interface between the common contact metal layer of the surface contact part 162 and the passivation layer is different from that of the contact interface between the common contact metal layer and the ohmic contact part 161. This arrangement further increases the bonding strengths of the surface contact part 162 to the passivation layer 17 formed using SiN and the ohmic contact part 161 formed using a metal.

Preferably, the ohmic contact part 161 includes one or more metal layers 1612 formed on the ohmic contact layer 1611 and interposed between the ohmic contact layer 1611 and the surface contact part 162 in addition to the ohmic contact layer 1611 in direct contact with the second conductive semiconductor layer 14.

Here, 70 to 90% of the area of the outer surface of the second ohmic contact layer 1611 is covered by the passivation layer 17 and only 10 to 30% of the area of the outer surface of the second ohmic contact layer 1611 is exposed to the outside through the second opening 172 (see FIG. 9) formed in the passivation layer 17. The surface contact part 162 includes a protrusion protruding from an insulating contact area in contact with the passivation layer 17 and including a current-carrying contact area in contact with the ohmic contact part 161 through the second opening 172 (see FIG. 9). Accordingly, the current-carrying contact area is placed inside the insulating contact area and the surface area of the insulating contact area is larger than the surface area of the current-carrying contact area. Due to the presence of the protrusion, the second electrode pad 16 is substantially "T" shaped in cross section.

On the other hand, the first solder bump 75 connects the first electrode pad 15 to a first electrode 65 disposed on the mount substrate 60 and the second solder bump 76 connects the second electrode pad 16 to a second electrode 66 disposed on the mount substrate 60. Here, the first solder bump 75 and the second solder bump 76 are in contact with the end surfaces of the first and second electrode pads 15 and 16 and spread under pressure to cover the side surfaces of the first and second electrode pads 15 and 16, respectively.

The first and electrode pads 15 and 16 include Au end layers 1539 and 1639 at ends thereof, respectively, for the purpose of improving the bonding strengths of the first and second electrode pads 15 and 16 to the first and second solder bumps 75 and 76, respectively, while preventing the oxidation of the first and second electrode pads 15 and 16. The end layers 1539 and 1639 are formed by Au plating or deposition. Each of the end layers 1539 and 1639 has a height of less than 1500 Å. If the heights of the end layers 1539 and 1639 exceed 1500 Å, Sn of the solder bumps excessively chemically bonds with the Au component, resulting in low bonding strengths of the first electrode pads 15 and 16 to the semiconductor stacked structure S. Thus, the heights of the end layers 1539 and 1639 are limited to less than 1500 Å.

Figure 5:
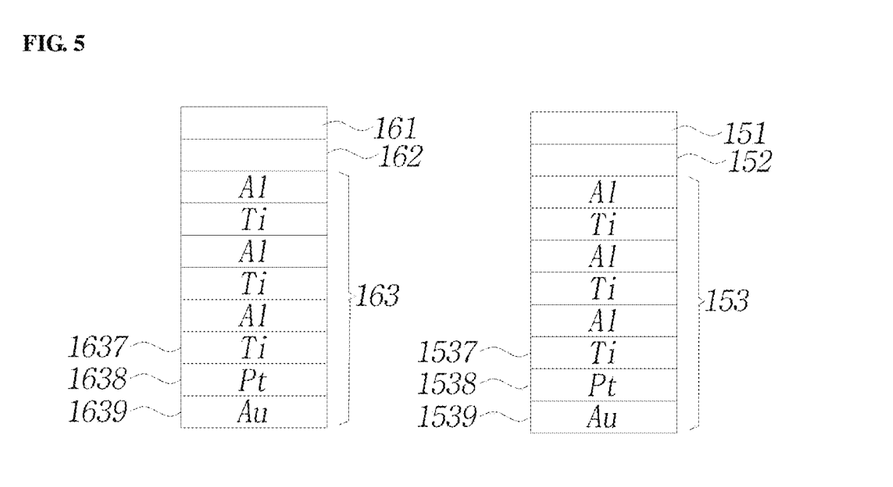
FIG. 5 illustrates examples of preferred stacked structures of a first electrode pad and a second electrode pad of the LED module illustrated in FIG. 4.
Figure 6:
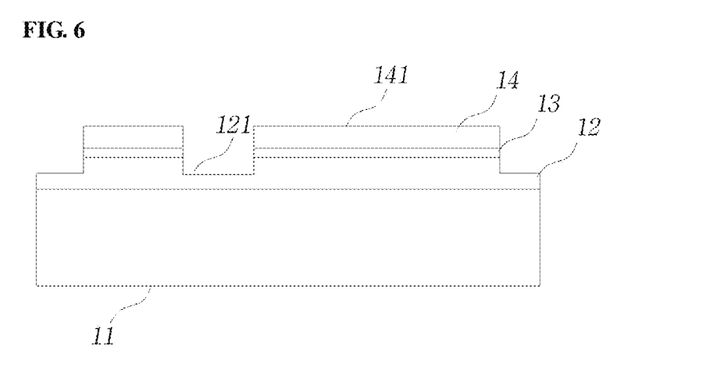
FIGS. 6 to 10 are views illustrating a method for constructing an LED chip according to one embodiment of the present invention.
Figure 7:
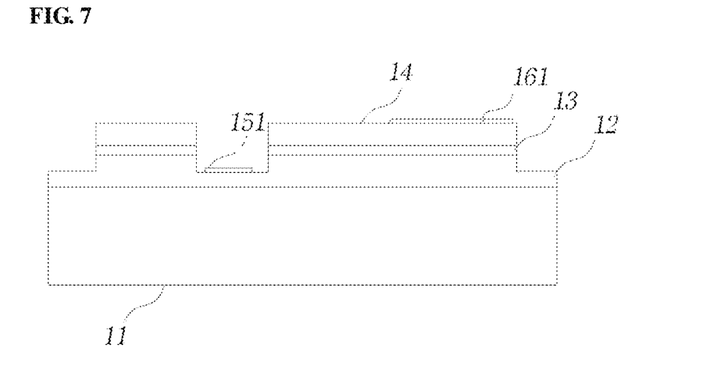
Figure 8:
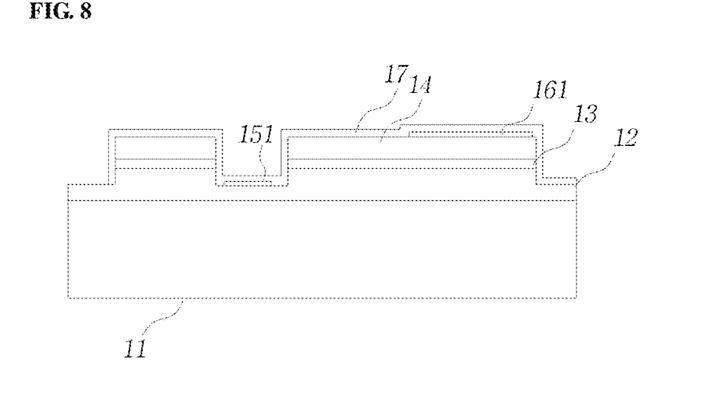

As best illustrated in FIG. 5, the multilayer body 153 of the first electrode pad includes an intermediate metal stacked structure formed by stacking two or more metals between the Au end layer 1539 and the surface contact part 152. The metals may be selected from the group including Pt, Cr, Al, Ni, Ti, Au, Cu, Mo, W, and Au. Likewise, the multilayer body 163 of the second electrode pad includes an intermediate metal stacked structure formed by stacking two or more metals between the Au end layer 1639 and the surface contact part 162. The metals may be selected from the group including Pt, Cr, Al, Ni, Ti, Au, Cu, Mo, W, and Au.

In this embodiment, Au is absent in the intermediate metal stacked structure between the Au end layer 1539 of the multilayer body 153 and the surface contact part 152 and Au is absent in the intermediate metal stacked structure between the Au end layer 1639 of the multilayer body 163 and the surface contact part 162. The solder bumps 75 and 76 (see FIG. 4) made of a metal material represented by Sn-M (where M is a metal selected from Ag, Au, Zn, and Pb) cover the side surfaces of the first and second electrode pads 15 and 16, respectively (see FIG. 4), but the Sn component of the solder bumps is inhibited from chemically bonding with the metal components present in the metal stacked structures other than the Au end layers 1539 and 1639. Alternatively, an Au layer may be present in the intermediate metal stacked structure between the Au end layer 1539 or 1639 and the contact body. In this case, the total thickness of the Au layers, including the Au end layer 1539 or 1639, is limited to 15% or less of the total thickness of the first or second multilayer body 153 or 163 so that chemical bonding between Au and Sn can be minimized.

The Au layer is preferably formed at a height of the intermediate metal stacked structure where the first or second electrode pad 15 or 16 is not covered with the solder bump.

The multilayer body 153 of the first electrode pad includes a Pt layer 1538 in contact with the Au end layer 1539 serving to improve solderability and prevent oxidation and a Ti layer 1537 in contact with the Pt layer 1538. The Au/Pt/Ti stacked structure is preferably formed at the most distant position from the ohmic contact layer 151. The multilayer body 163 of the first electrode pad includes a Pt layer 1638 in contact with the Au end layer 1639 serving to improve solderability and prevent oxidation and a Ti layer 1637 in contact with the Pt layer 1638. The Au/Pt/Ti stacked structure is preferably formed at the most distant position from the ohmic contact layer 161. The Ti layers 1537 and 1637 function as adhesive layers and the Pt layers 1538 and 1638 act as diffusion barrier layers to prevent the Sn component of the solders from chemically bonding with the constituent metal material of the pads. Instead of excluding the use of an Au layer other than the Au end layer 1539 or minimizing the thickness of an Au layer, a metal stacked structure consisting of Al layers and Ti layers stacked alternately on one another is preferably interposed between the Pt layer 1538 and the ohmic contact layer 1511. Here, the total thickness of the Al layers is preferably at least two times that of the Ti layers. It is preferred that the Au end layer 1539 has the smallest thickness among the individual metal layers other than the ohmic contact layer. Instead of excluding the use of an Au layer other than the Au end layer 1639 or minimizing the thickness of an Au layer, a metal stacked structure consisting of Al layers and Ti layers stacked alternately on one another is preferably interposed between the Pt layer 1638 and the ohmic contact layer 1611. Here, the total thickness of the Al layers is preferably at least two times that of the Ti layers. It is preferred that the Au end layer 1639 has the smallest thickness among the individual metal layers other than the ohmic contact layer.

Referring again to FIG. 4, the LED module is fabricated by the following procedure. First, the ohmic contact layers 1511 and 1611 constituting portions of the first and second electrode pads 15 and 16 are formed on the outer surfaces of the first and second conductive semiconductor layers 12 and 14, respectively. Thereafter, the passivation layer 17 is formed so as to cover the ohmic contact layers 1511 and 1611, the first conductive semiconductor layer 12, and the second conductive semiconductor layer 14. Then, the openings 171 and 172, through which the ohmic contact layers 1511 and 1611 are exposed, respectively, are formed in the passivation layer 17. The other parts of the first electrode pad 15 and the second electrode pad 16 are formed, including the part in contact with the ohmic contact layer 1511 inside the opening 171, the part in contact with the ohmic contact layer 1611 inside the opening 172, the part in contact with the passivation layer 17 outside the opening 171, and the part in contact with the passivation layer 17 outside the opening 172, so that the Sn component of the solder can be completely blocked from reaching the ohmic contact layer 1511 of the ohmic contact part 151 and the ohmic contact layer 1611 of the ohmic contact part 161 when the first electrode pad 15 and the second electrode pad 16 are connected to the electrodes disposed on the mount substrate 60 through the first and second solder bumps 75 and 76, respectively.

Referring now to FIGS. 6 to 10, a description will be given concerning a method for fabricating an LED module according to one embodiment of the present invention.

The method essentially includes a process for preparing an LED chip and a process for mounting the LED chip on a submount substrate using solder bumps.

As illustrated in FIGS. 6 to 10, the LED chip preparation process includes: forming a semiconductor stacked structure including a first conductive semiconductor layer 12, an active layer 13, and a second conductive semiconductor layer 14 formed in this order on a substrate 11, the outer surface 121 of the first conductive semiconductor layer 12 and the outer surface 141 of the second conductive semiconductor layer 14 being exposed (see FIG. 6); forming a first ohmic contact layer 1511 on one area of the outer surface of the first conductive semiconductor layer 12 and forming a second ohmic contact layer 1611 on one area of the outer surface of the second conductive semiconductor layer 14 (see FIG. 7); forming a passivation layer 17 on the outer surface of the semiconductor stacked structure so as to cover the first ohmic contact layer 1511 and the second ohmic contact layer 1611 (see FIG. 8); forming a first opening 171 through which the outer surface of the first ohmic contact layer 1511 is sectionwise and partially exposed and forming a second opening 172 through which the outer surface of the second ohmic contact layer 1611 is sectionwise and partially exposed (see FIG. 9); and forming other parts of first and second electrode pads 15 and 16, including a metal layer 1512 (see FIG. 4) as a portion of an ohmic contact part in contact with the first ohmic contact layer 1511 (see FIG. 4) inside the first opening 171 (see FIG. 9), a metal layer 1612 (see FIG. 4) as a portion of an ohmic contact part in contact with the second ohmic contact layer 1611 (see FIG. 4) inside the second opening 172 (see FIG. 9), surface contact parts 152 and 162 (see FIG. 4), and multilayer bodies 153 and 163 (see FIG. 4).

The foregoing description has been mainly directed to an LED module in which an LED chip is mounted on a mount substrate by flip-chip bonding.

Figure 11:
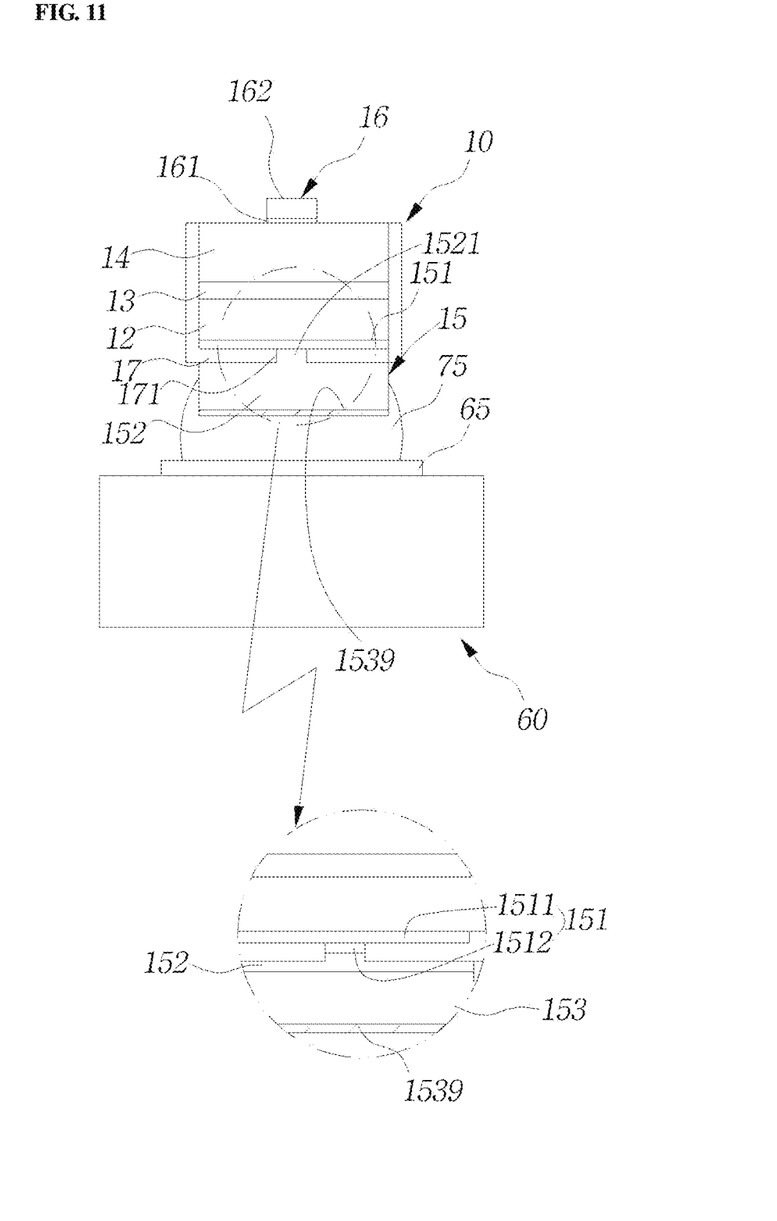
FIG. 11 illustrates an LED module according to a further embodiment of the present invention.

FIG. 11 explains an LED module including a vertical LED chip according to a further embodiment of the present invention.

Referring to FIG. 11, the LED module includes a mount substrate 60 and a vertical LED chip 10 mounted on the mount substrate 60. When the LED chip 10 is mounted on the mount substrate 60, an electrode pad 15 of the LED chip 10 is connected to an electrode 65 of the mount substrate 60 through a solder bump 75.

The LED chip 10 includes a semiconductor stacked structure including a first conductive semiconductor layer 12, an active layer 13, and a second conductive semiconductor layer 14 formed in this order. Here, the first conductivity may be n-type or p-type. The second conductivity is opposite to the first conductivity and may be n-type or p-type.

A lower ohmic contact layer 1511 having predetermined thickness and width is formed on one area of the lower outer surface of the semiconductor stacked structure and an upper ohmic contact layer 1611 is formed on one area of the upper outer surface of the semiconductor stacked structure. The lower ohmic contact layer 1511 is a portion of a lower electrode pad 15 and the upper ohmic contact layer 1611 is a portion of an upper electrode pad 16.

The LED chip 10 includes an electrically insulating passivation layer 17 that covers at least the lower outer surface of the semiconductor stacked structure. The lower ohmic contact layer 1511 directly formed on a portion of the lower outer surface of the semiconductor stacked structure is covered by the passivation layer 17.

The passivation layer 17 includes an opening 171 through which the outer surface of the lower ohmic contact layer 1511 is sectionwise exposed. The ratio of the area a of the opening 171 to the area A of the outer surface of the lower ohmic contact layer 1511 can be represented by:

$$a/A \approx 0.1 \sim 0.3$$

Here, the semiconductor stacked structure consists of GaAs-based semiconductor layers capable of emitting red light, which is preferable for current diffusion. An alloy material including Au, such as GeAu, GeNiAu, TiPtAu, BeAu or PdGeAu, can be advantageously used for the lower ohmic contact layer 1511.

The lower electrode pad 15 includes a multilayer body 153 including a plurality of metal layers and a contact body connected to the multilayer body 153. The contact body includes a surface contact part 152 in contact with the passivation layer 17 outside the opening 171 and an ohmic contact part 151 in contact with the first conductive semiconductor layer 12 through the opening 171.

Preferably, the multilayer body 153 includes a stacked structure consisting of a plurality of different metal layers stacked alternately on one another, which will be explained in detail hereinafter. The surface contact part 152 includes a common contact metal layer in simultaneous contact with the passivation layer 17 and the ohmic contact part 151. The surface contact part 152 may be a single metal layer. In this case, the surface contact part 152 may be the same as the common contact metal layer. Alternatively, the surface contact part 152 may include two or more metal layers. In this case, the surface contact part 152 may be provided with one or more metal layers interposed between the common contact metal layer and the multilayer body 153 as well as the common contact metal layer in simultaneous contact with the passivation layer 17 and the ohmic contact part 151.

The height of the contact interface between the common contact metal layer of the surface contact part 152 and the passivation layer is different from that of the contact interface between the common contact metal layer and the ohmic contact part 151. This arrangement further increases the bonding strengths of the surface contact part 152 to the passivation layer 17 formed using SiN and the ohmic contact part 151 formed using a metal.

Preferably, the ohmic contact part 151 includes one or more metal layers 1512 formed on the ohmic contact layer 1511 and interposed between the ohmic contact layer 1511 and the surface contact part 152 in addition to the ohmic contact layer 1511 in direct contact with the first conductive semiconductor layer 12.

Here, 70 to 90% of the area of the outer surface of the first ohmic contact layer 1511 is covered by the passivation layer 17 and only 10 to 30% of the area of the outer surface of the first ohmic contact layer 1511 is exposed to the outside through the first opening 171 formed in the passivation layer 17. The surface contact part 152 includes a protrusion protruding from an insulating contact area in contact with the passivation layer 17 and including a current-carrying contact area in contact with the ohmic contact part 151 through the opening 171. Accordingly, the current-carrying contact area is placed inside the insulating contact area and the surface area of the insulating contact area is larger than the surface area of the current-carrying contact area. Due to the presence of the protrusion, the first electrode pad 15 is substantially "T" shaped in cross section.

The solder bump 75 connects the lower electrode pad 15 to an electrode 65 disposed on the mount substrate 60. Here, the solder bump 75 is in contact with the lower end surface of the lower electrode pad 15 and spreads under pressure to cover the side surface of the lower electrode pad 15.

The lower electrode pad 15 includes an Au end layer 1539 at an end thereof for the purpose of improving the solderability of the solder of the solder bump 75 while preventing the oxidation of the lower electrode pad 15. The end layer 1539 is formed by Au plating or deposition. The end layer 1539 has a height of less than 1500 Å. If the height of the end layer 1539 exceeds 1500 Å, Sn of the solder bump excessively chemically bonds with the Au component, resulting in a low bonding strength of the lower electrode pad 15 to the semiconductor stacked structure. Thus, the height of the Au end layer 1539 is limited to less than 1500 Å.

The lower electrode pad 15 includes an intermediate metal stacked structure formed by stacking two or more metals between the Au end layer 1539 and the lower ohmic contact layer 1511. The metals may be selected from the group including Pt, Cr, Al, Ni, Ti, Au, Cu, Mo, W, and Au. Au is absent in the multilayer body 153 between the Au end layer 1539 and the lower ohmic contact layer 1511 or the total thickness of Au layers is limited to 15% or less of the thickness of the multilayer body. Accordingly, although the solder bump made of a metal material represented by Sn-M (where M is a metal selected from Ag, Au, Zn, and Pb) covers the side surface of the lower electrode pad 15, little or no chemical bonding occurs between the Sn component of the solder bump and the metal components of the metal stacked structure other than the Au end layer 1539.

When the GaAs-based LED chip including the electrode pad(s) is mounted on the submount substrate using a solder paste represented by Sn-M (where M is a metal selected from Ag, Au, Zn, and Pb), the ohmic contact layers as portions of the electrode pad(s) may include at least one metal compound selected from the group consisting of GeAu, GeNiAu, TiPtAu, BeAu, and PdGeAu. Here, each of the ohmic contact layers can be formed by stacking two or more layers including different single metal components to thicknesses of several to several hundreds of nm and rapidly annealing the stack to ~170-430° C. depending on the kinds of the metal components. The constructions of other parts of the lower electrode pad 15 are not explained herein but are the same as those of the first electrode pad explained in the previous embodiment.

What is claimed is:
1. An LED module comprising:
an LED chip comprising a substrate, a semiconductor stacked structure formed on the substrate and including a first conductive semiconductor layer, a second conductive semiconductor layer, and an active layer interposed between the first conductive semiconductor layer and the second conductive semiconductor layer, a first electrode pad connected to the first conductive semiconductor layer, and a second electrode pad connected to the second conductive semiconductor layer;
a mount substrate comprising electrodes, one of the electrodes connected to the first electrode pad of the LED chip through a solder bump; and a passivation layer covering an outer surface of the semiconductor stacked structure and including an opening exposing an outer surface of an ohmic contact layer;

wherein the passivation layer covers 70 to 90% of an area of the outer surface of the ohmic contact layer and exposes 10 to 30% of an area of the outer surface of the ohmic contact layer.

2. The LED module according to claim 1, wherein the first electrode pad comprises a multilayer body formed of a plurality of metal layers and a surface contact part connected to the multilayer body.

3. The LED module according to claim 1, wherein the first electrode pad comprises an Au end layer, and the Au end layer has a thickness of less than 1,500 Å.

4. The LED module according to claim 3, wherein the Au end layer has a thickness of less than 15% of the thickness of the multilayer body.

5. The LED module according to claim 1, wherein the ohmic contact layer is formed on the first conductive semiconductor layer.

6. The LED module according to claim 1, wherein the first electrode pad is connected to the first conductive layer through the opening.

7. The LED module according to claim 2, wherein the ohmic contact layer is connected to the surface contact part through one or more metal layers.

8. The LED module according to claim 2, wherein the surface contact part is in contact with the passivation layer outside the opening.

9. The LED module according to claim 3, wherein the first electrode pad comprises an intermediate metal stacked structure formed by stacking at least two metals between the Au end layer and a surface contact part.

10. An LED module comprising:
an LED chip comprising a substrate, a semiconductor stacked structure formed on the substrate and including a first conductive semiconductor layer, a second conductive semiconductor layer, and an active layer interposed between the first conductive semiconductor layer and the second conductive semiconductor layer, a first electrode pad connected to the first conductive semiconductor layer, and a second electrode pad connected to the second conductive semiconductor layer;
a mount substrate comprising at least one electrode connected to the first electrode pad of the LED chip through a solder bump; and
a passivation layer covering an outer surface of the semiconductor stacked structure and including an opening exposing an outer surface of an ohmic contact layer;
wherein each of the first electrode pad comprises a surface contact part connected to the ohmic contact layer and a multilayer body connected to the surface contact part and formed of an Au end layer and a metal stacked structure without Au between the surface contact part and the Au end layer,
wherein the passivation layer covers 70 to 90% of an area of the outer surface of the ohmic contact layer and exposes 10 to 30% of an area of the outer surface of the ohmic contact layer.

11. The LED module according to claim 10, wherein the Au end layer has a thickness of less than 1,500 Å.

12. The LED module according to claim 10, wherein the Au end layer has a thickness of less than 15% of the thickness of the multilayer body.

13. The LED module according to claim 10, wherein the ohmic contact layer is connected to the surface contact part through one or more metal layers.

14. The LED module according to claim 10, wherein the solder bump partially covers a side surface of the first electrode pad.

15. The LED module according to claim 10, wherein the solder bump is formed of a solder material represented by Sn-M (where M is a metal).

16. An LED module comprising:
a mount substrate comprising electrodes; and
an LED chip comprising a semiconductor stacked structure, a passivation layer covering an outer surface of the semiconductor stacked structure, and an electrode pad connected to the semiconductor stacked structure through an opening formed in the passivation layer;
wherein the electrode pad comprises:
a multilayer body formed of a plurality of metal layers;
a surface contact part connected to the multilayer body and the passivation layer;
an ohmic contact layer connected to the semiconductor stacked structure; and
one or more metal layers formed between the ohmic contact layer and the surface contact layer;
wherein a surface of the surface contact part contacting the passivation layer has a different height from a surface of the surface contact part contacting the metal layers,
wherein the passivation layer covers 70 to 90% of an area of the outer surface of the ohmic contact layer and exposes 10 to 30% of an area of the outer surface of the ohmic contact layer.

17. The LED module according to claim 16, wherein the multilayer body comprises an Au end layer having a thickness of less than 1,500 Å and the thickness of less than 15% of the thickness of the multilayer body.

18. The LED module according to claim 16, wherein the multilayer body comprises a structure in which different metal layers are alternately stacked.

19. The LED module according to claim 16, wherein the surface contact part comprises a protrusion contacting the ohmic contact layer.

* * * * *